(12) United States Patent
Matsumoto et al.

(10) Patent No.: US 10,008,611 B2
(45) Date of Patent: Jun. 26, 2018

(54) THIN FILM TRANSISTOR AND ORGANIC EL DISPLAY DEVICE

(71) Applicant: JOLED INC., Tokyo (JP)

(72) Inventors: Mitsutaka Matsumoto, Kyoto (JP); Arinobu Kanegae, Osaka (JP)

(73) Assignee: JOLED INC., Tokyo (JP)

(*) Notice: Subject to any disclaimer, the term of this patent is extended or adjusted under 35 U.S.C. 154(b) by 0 days. days.

(21) Appl. No.: 15/321,975

(22) PCT Filed: Jun. 24, 2015

(86) PCT No.: PCT/JP2015/003185
§ 371 (c)(1),
(2) Date: Dec. 23, 2016

(87) PCT Pub. No.: WO2015/198604
PCT Pub. Date: Dec. 30, 2015

(65) Prior Publication Data
US 2017/0141231 A1   May 18, 2017

(30) Foreign Application Priority Data
Jun. 26, 2014 (JP) .................................. 2014-131602

(51) Int. Cl.
*H01L 29/08* (2006.01)
*H01L 29/786* (2006.01)
(Continued)

(52) U.S. Cl.
CPC ........ *H01L 29/7869* (2013.01); *H01L 21/383* (2013.01); *H01L 21/385* (2013.01);
(Continued)

(58) Field of Classification Search
CPC ........... H01L 29/7869; H01L 29/78603; H01L 29/24; H01L 29/78696; H01L 29/66969;
(Continued)

(56) References Cited

U.S. PATENT DOCUMENTS 6,372,608 B1   4/2002   Shimoda et al.
7,109,655 B2 *  9/2006   Kurihara ................ H05B 33/04
                                                            313/504
(Continued)

FOREIGN PATENT DOCUMENTS

JP   2008-211191 A   9/2008
JP   2009-76877 A   4/2009
(Continued)

OTHER PUBLICATIONS

International Search Report in International Patent Application No. PCT/JP2015/003185, dated Sep. 15, 2015.
(Continued)

*Primary Examiner* — Thinh T Nguyen
(74) *Attorney, Agent, or Firm* — Hauptman Ham, LLP

(57) ABSTRACT

A thin film transistor includes: a substrate; an undercoat layer disposed on the substrate; an oxide semiconductor layer formed above the undercoat layer and including at least indium; a gate insulating layer located opposite the undercoat layer with the oxide semiconductor layer being between the gate insulating layer and the undercoat layer; a gate electrode located opposite the oxide semiconductor layer with the gate insulating layer being between the gate electrode and the oxide semiconductor layer; and a source electrode and a drain electrode electrically connected to the oxide semiconductor layer, wherein fluorine is included in a region which is an internal region in the oxide semiconductor layer and is close to the undercoat layer.

11 Claims, 14 Drawing Sheets

(51) Int. Cl.
  *H01L 29/24* (2006.01)
  *H01L 29/66* (2006.01)
  *H01L 21/383* (2006.01)
  *H01L 21/385* (2006.01)
  *H01L 27/32* (2006.01)
  *H01L 27/12* (2006.01)

(52) U.S. Cl.
  CPC ........ *H01L 29/24* (2013.01); *H01L 29/66969* (2013.01); *H01L 29/78603* (2013.01); *H01L 29/78696* (2013.01); *H01L 27/1225* (2013.01); *H01L 27/3262* (2013.01)

(58) Field of Classification Search
  CPC . H01L 21/783; H01L 21/385; H01L 27/3262; H01L 27/1225; H01L 21/02565; H01L 21/02631; H01L 21/02667; H01L 27/11521
  USPC .... 257/40, 43, 57, E21.459, 59; 438/82, 99, 438/85, 86, 104
  See application file for complete search history.

(56) References Cited

U.S. PATENT DOCUMENTS

| | | | |
|---|---|---|---|
| 7,838,328 | B2 | 11/2010 | Isa |
| 8,300,031 | B2* | 10/2012 | Kimura .................... G09G 3/20 345/204 |
| 2002/0146893 | A1 | 10/2002 | Shimoda et al. |
| 2003/0197466 | A1* | 10/2003 | Yamazaki ........... H01L 27/3246 313/504 |
| 2003/0224582 | A1 | 12/2003 | Shimoda et al. |
| 2004/0219762 | A1 | 11/2004 | Shimoda et al. |
| 2006/0030122 | A1 | 2/2006 | Shimoda et al. |
| 2006/0238135 | A1* | 10/2006 | Kimura .................... G09G 3/20 315/169.3 |
| 2007/0010067 | A1 | 1/2007 | Shimoda et al. |
| 2009/0004772 | A1 | 1/2009 | Jinbo et al. |
| 2009/0061721 | A1* | 3/2009 | Isa ...................... H01L 27/1214 445/24 |
| 2010/0051940 | A1 | 3/2010 | Yamazaki et al. |
| 2010/0102312 | A1* | 4/2010 | Yamazaki ........... H01L 29/7869 257/43 |
| 2011/0140116 | A1 | 6/2011 | Morosawa et al. |
| 2011/0215325 | A1* | 9/2011 | Yamazaki ........... H01L 27/1203 257/57 |
| 2011/0248291 | A1 | 10/2011 | Jinbo et al. |
| 2011/0284854 | A1 | 11/2011 | Endo et al. |
| 2012/0001168 | A1 | 1/2012 | Ichijo et al. |
| 2012/0122277 | A1 | 5/2012 | Yamazaki et al. |
| 2015/0050774 | A1 | 2/2015 | Yamazaki et al. |
| 2015/0053975 | A1 | 2/2015 | Endo et al. |
| 2015/0270321 | A1 | 9/2015 | Jinbo et al. |
| 2016/0079439 | A1 | 3/2016 | Yamazaki et al. |
| 2016/0380106 | A1 | 12/2016 | Endo et al. |

FOREIGN PATENT DOCUMENTS

| | | |
|---|---|---|
| JP | 2010-80947 A | 4/2010 |
| JP | 2010-161227 A | 7/2010 |
| JP | 2010-251591 A | 11/2010 |
| JP | 2011-119355 A | 6/2011 |
| JP | 2011-205078 A | 10/2011 |
| JP | 2012-9845 A | 1/2012 |
| JP | 2012-33913 A | 2/2012 |
| JP | 2004-140381 A | 5/2014 |

OTHER PUBLICATIONS

Hideyuki Omura et al., "First-principles study of native point defects in crystalline indium gallium zinc oxide", Journal of Applied Physics, May 8, 2009, pp. 093712-1 to 093712-7, vol. 105, American Institute of Physics, N.Y., U.S.A.

Haruka Yamazaki et al., "Highly Realiable a-IGZO TFT with SiN$\chi$ Gate Insulator deposited by SiF$_4$/N$_2$", AM-FPD '12 P-22, 2012, pp. 163-166, Japan.

Office Action in JP Application No. 2016-529085, dated Nov. 28, 2017, 3pp.

* cited by examiner

THIN FILM TRANSISTOR AND ORGANIC EL DISPLAY DEVICE

RELATED APPLICATIONS

The present application is a National Phase of International Application Number PCT/JP2015/003185, filed Jun. 24, 2015, which claims priority to Japanese Application Number 2014-131602, filed Jun. 26, 2014.

TECHNICAL FIELD

The present invention relates to a thin film transistor (TFT) and an organic EL display device, and in particular to an oxide semiconductor thin film transistor having an oxide semiconductor layer in an active layer, and an organic EL display device including the oxide semiconductor thin film transistor.

BACKGROUND ART

Active matrix display devices such as liquid crystal display devices and organic electroluminescent (EL) display devices use TFTs as switching elements or driver elements.

In recent years, active development has been conducted on, as next-generation TFTs, oxide semiconductor TFTs which use an oxide semiconductor such as $InGaZnO_x$ (IGZO) for channel layers. For example, Patent Literature (PTL) 1 discloses an oxide semiconductor TFT having an oxide semiconductor layer as a channel layer.

CITATION LIST

Patent Literature

[PTL 1]
Japanese Unexamined Patent Application Publication No. 2010-161227
[PTL 2]
Japanese Unexamined Patent Application Publication No. 2004-140381
[PTL 3]
Japanese Unexamined Patent Application Publication No. 2010-80947

Non Patent Literature

[NPL 1]
Hideyuki Omura, Hideya Kumomi, Kenji Nomura, Toshio Kamiya, Masahiro Hirano and Hideo Hosono, "First-principles study of native point defects in crystalline indium gallium zinc oxide", J. Appl. Phys. 105, pp. 093712-093719, 2009
[NPL 2]
Haruka Yamazaki, Mami Fujii, Yoshihiro Ueoka, Yasuaki Ishikawa, Masaki Fujiwara, Eiji Takahashi, and Yukiharu Uraoka, "High Reliable a-IGZO TFTs with SiNx Gate Insulator deposited bu SiF4/N2", AM-FPD P-22(2012)

SUMMARY OF INVENTION

Technical Problem

The electrical characteristics of oxide semiconductor TFTs are susceptible to oxygen or hydrogen (see NPL 1, for example). For this reason, it has been difficult to obtain oxide semiconductor TFTs having high reliability.

The present invention has been conceived to solve such a problem, and an object of the present invention is to provide a thin film transistor having high reliability, and an organic EL display device.

Solution to Problem

In order to achieve the above object, a thin film transistor according to an aspect of the present invention includes: a substrate; an inorganic layer disposed on the substrate; an oxide semiconductor layer formed above the inorganic layer and including at least indium; an insulating layer located opposite the inorganic layer with the oxide semiconductor layer being between the insulating layer and the inorganic layer; a gate electrode located opposite the oxide semiconductor layer with the insulating layer being between the gate electrode and the oxide semiconductor layer; a source electrode and a drain electrode electrically connected to the oxide semiconductor layer, wherein fluorine is included in a region which is an internal region in the oxide semiconductor layer and is close to the inorganic layer.

Advantageous Effects of Invention

The present invention allows a thin film transistor and an organic EL display device to be less susceptible to oxygen or hydrogen, thereby achieving the thin film transistor having high reliability and high robustness, and the organic EL display device. In particular, it is possible to achieve a thin film transistor and an organic EL display device which are less susceptible to hydrogen from an inorganic layer such as an undercoat layer and a separation layer.

DESCRIPTION OF EMBODIMENT

Figure 1:
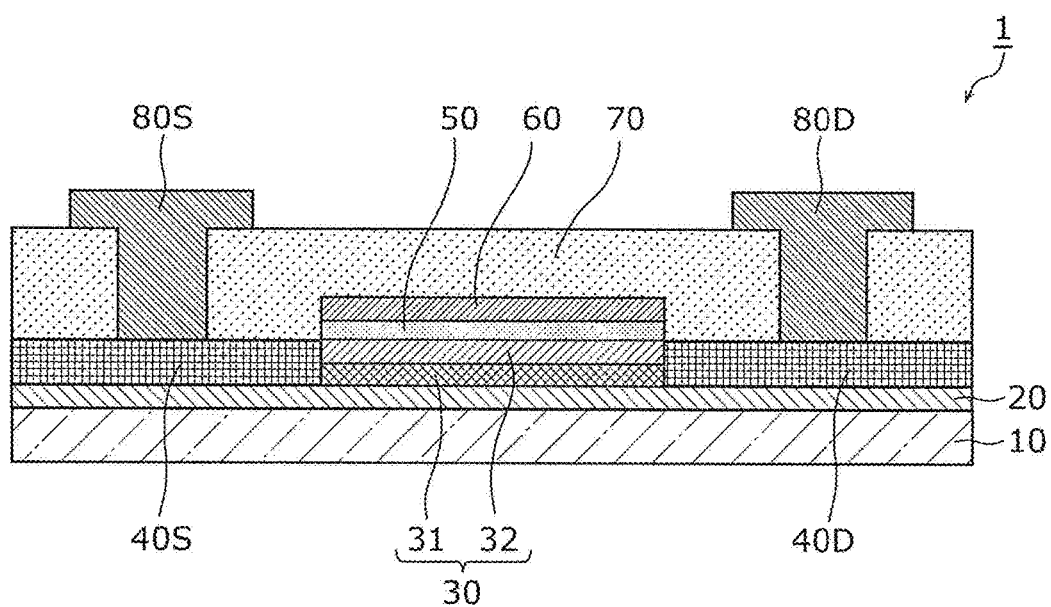
FIG. 1 is a cross-sectional view illustrating a structure of a thin film transistor according to an embodiment.

A thin film transistor according to an aspect of the present invention includes: a substrate; an inorganic layer disposed on the substrate; an oxide semiconductor layer formed above the inorganic layer and including at least indium; an insulating layer located opposite the inorganic layer with the oxide semiconductor layer being between the insulating layer and the inorganic layer; a gate electrode located opposite the oxide semiconductor layer with the insulating layer being between the gate electrode and the oxide semiconductor layer; a source electrode and a drain electrode electrically connected to the oxide semiconductor layer, wherein fluorine is included in a region which is an internal region in the oxide semiconductor layer and is close to the inorganic layer.

According to the aspect of the present invention, fluorine is included in the region that is the internal region in the oxide semiconductor layer and is close to the gate insulating layer. The region close to the inorganic layer is, for example, a region located approximately 30 nm from the inorganic layer in a thickness direction.

Fluorine has higher binding energy with metal than oxygen. Accordingly, including fluorine in the oxide semiconductor layer enables fluorine to eliminate dangling bonds or an unstable site caused by oxygen deficiency in the oxide semiconductor layer. In other words, including fluorine in the oxide semiconductor layer makes it possible to compensate the oxygen deficiency in the oxide semiconductor layer.

Moreover, including fluorine in the oxide semiconductor layer prevents hydrogen entering the oxide semiconductor layer from bonding with the oxide semiconductor layer. With this, it is possible to prevent hydrogen from entering the oxide semiconductor layer from the inorganic layer such as an undercoat layer and a separation layer, thereby suppressing generation of charge carriers resulting from bonding of oxygen and hydrogen in the oxide semiconductor layer. In short, including fluorine in the oxide semiconductor layer makes it possible to improve hydrogen resistance of the oxide semiconductor layer.

Furthermore, including fluorine in the oxide semiconductor layer results in metallic elements included in the oxide semiconductor layer being chemically bonded with fluorine, which makes it possible to stabilize a structure of the oxide semiconductor layer.

As just described, according to the aspect of the present invention, it is possible to make the oxide semiconductor layer less susceptible to hydrogen damage resulting from the inorganic layer such as the undercoat layer and the separation layer as well as stabilize the structure of the oxide semiconductor layer. With this, it is possible to achieve a thin film transistor having high reliability and high robustness.

Moreover, in the thin film transistor according to the aspect of the present invention, the inorganic layer may be an undercoat layer including silicon oxide or silicon oxynitride and be formed on a top surface of the substrate.

According to the aspect of the present invention, the region including fluorine in the oxide semiconductor layer can block hydrogen from entering the oxide semiconductor layer from the undercoat layer including silicon oxide or silicon oxynitride.

Moreover, in the thin film transistor according to the aspect of the present invention, the inorganic layer may be formed by stacking insulating films.

According to the aspect of the present invention, even when an undercoat layer of stacked films is used, the region including fluorine in the oxide semiconductor layer can block hydrogen from the undercoat layer.

Moreover, in the thin film transistor according to the aspect of the present invention, the inorganic layer may be a layer including amorphous silicon as a main component and be formed on an under surface of the substrate.

According to the aspect of the present invention, the region including fluorine in the oxide semiconductor layer can block hydrogen which is generated from amorphous silicon and enters the oxide semiconductor layer through the substrate.

Moreover, in the thin film transistor according to the aspect of the present invention, a fluorine concentration of the region close to the inorganic layer in the oxide semiconductor layer may be higher than a fluorine concentration of a region close to the insulating layer in the oxide semiconductor layer.

According to the aspect of the present invention, hydrogen damage can be effectively reduced on a back channel side, and a high on-state current can be maintained on a front channel side.

Moreover, in the thin film transistor according to the aspect of the present invention, a region including fluorine which is the region in which fluorine is included in the oxide semiconductor layer may have a fluorine concentration gradient in a thickness direction.

According to the aspect of the present invention, it is possible to effectively exert the aforementioned effects of including fluorine.

Moreover, in the thin film transistor according to the aspect of the present invention, the region including fluorine in the oxide semiconductor layer may have a film thickness of at least 15 nm.

According to the aspect of the present invention, even when hydrogen diffuses from the outside of the oxide semiconductor layer by annealing or the like, the region including fluorine can effectively block hydrogen from entering the oxide semiconductor layer.

Moreover, in the thin film transistor according to the aspect of the present invention, the region including fluorine in the oxide semiconductor layer may have a film thickness of at least 20 nm.

According to the aspect of the present invention, it is possible to easily perform process control of the oxide semiconductor layer.

Moreover, in the thin film transistor according to the aspect of the present invention, a fluorine concentration of the oxide semiconductor layer may be higher than a hydrogen concentration of the oxide semiconductor layer.

According to the aspect of the present invention, it is possible to more effectively exert the aforementioned effects of including fluorine.

Moreover, in the thin film transistor according to the aspect of the present invention, metallic elements included in the oxide semiconductor layer may further include at least one or both of gallium and zinc.

According to the aspect of the present invention, target compatibility with large mass production facilities is increased, and thus production costs can be reduced.

Moreover, an organic EL display device according to an aspect of the present invention includes any of the aforementioned thin film transistors, the organic EL display device including: pixels arranged in a matrix; and organic elements each formed corresponding to a different one of the pixels, wherein the thin film transistor is a driving transistor which drives the organic EL elements.

According to the aspect of the present invention, the thin film transistor having high reliability and high robustness is used as the driving transistor which drives the organic EL elements, and thus it is possible to achieve the organic EL display device superior display performance.

[Embodiment]

The following describes an embodiment of the present invention with reference to the accompanying drawings. The embodiment described below is merely a preferred illustration of the present invention. Values, shapes, materials, components, arrangement and connection of the components, processes (steps), order of the processes, and the like shown in the following embodiment are merely illustrative and are not intended to limit the present invention. Therefore, among the components of the embodiment below, components not recited in any one of independent claims are described as arbitrary components.

The figures are schematic illustration and do not necessarily limit the present invention to that precisely shown. In the figures, the same reference sign is used to refer to substantially the same component, and description already set forth is may be omitted or simplified.

[Structure of Thin Film Transistor]

First, the following describes a thin film transistor 1 according to the embodiment of the present invention with reference to FIG. 1. FIG. 1 is a cross-sectional view illustrating a structure of a thin film transistor according to the embodiment of the present invention.

As illustrated by FIG. 1, the thin film transistor 1 according to the embodiment is a top gate oxide semiconductor TFT having an oxide semiconductor layer as a channel layer.

The thin film transistor 1 includes: a substrate 10; an undercoat layer 20; an oxide semiconductor layer 30 to be a channel layer; an oxide semiconductor layer 40S to be a source region; an oxide semiconductor layer 40D to be a drain region; a gate insulating layer 50; a gate electrode 60; an interlayer insulating layer 70; and a source electrode 80S and a drain electrode 80D.

The following describes in detail each component of the thin film transistor 1 according to the embodiment.

The substrate 10 is a glass substrate made of a glass material such as quartz glass, alkali-free glass, and high heat-resistant glass. It is to be noted that the substrate 10 is not limited to the glass substrate and may be a resin substrate or the like. Moreover, the substrate 10 is not a rigid substrate but may be a flexible substrate including a single layer of a film material such as polymide, polyethylene terephthalate, and polyethylene naphthalate, or stacked layers of these.

The undercoat layer 20 is an example of an inorganic layer disposed on the substrate 10. The undercoat layer 20 is formed on a top surface of the substrate 10. In the embodiment, the undercoat layer 20 is formed on a surface of the substrate 10 (side on which an oxide semiconductor layer is formed). The undercoat layer 20 is formed to prevent impurities such as sodium and phosphorus included in the substrate 10 (glass substrate) or moisture permeated from the air from entering the oxide semiconductor layers 30, 40S, and 40D.

The undercoat layer 20 is a single layer insulating layer of an oxide insulating layer or a nitride insulating layer, or a stacked insulating layer including an oxide insulating layer and a nitride insulating layer. In one instance, a single layer film of silicon nitride ($SiN_x$), silicon oxide ($SiO_y$), silicon oxynitride ($SiO_yN_x$), or aluminum oxide ($AlO_x$), or stacked films of these can be used as the undercoat layer 20. In the embodiment, the undercoat layer 20 is a stacked film formed by stacking insulating films. It is to be noted that a film thickness of the undercoat layer 20 is preferably set to be from 100 to 500 nm.

The oxide semiconductor layer 30 is used as a channel layer. In other words, the oxide semiconductor layer 30 is a semiconductor layer including a channel region opposing the gate electrode 60 with the gate insulating layer 50 between the channel region and the gate electrode 60. By contrast, the oxide semiconductor layer 40S is a semiconductor layer to be a source region provided on one side of the oxide semiconductor layer 30. Moreover, the oxide semiconductor layer 40D is a semiconductor layer to be a drain region provided on the other side of the oxide semiconductor layer 30. The oxide semiconductor layers 40S and 40D each are a low resistance region (offset region) having a resistance value lower than that of the oxide semiconductor layer 30.

Moreover, in each of the oxide semiconductor layers 40S and 40D, a resistance value of an upper region (region on a side of the interlayer insulating layer 70) is less than that of a lower region (region on a side of the undercoat layer 20). Stated differently, in each of the oxide semiconductor layers 40S and 40D, the resistance values differ from each other in a stack direction, and the resistance value of the upper layer portion is less than that of the lower layer portion.

The oxide semiconductor layers 30, 40S, and 40D are formed in a predetermined shape, on the undercoat layer 20. Moreover, the oxide semiconductor layers 30, 40S, and 40D are made of the same material. A transparent amorphous oxide semiconductor (TAOS) is used for the material of the oxide semiconductor layers 30, 40S, and 40D, for example. Metallic elements included in each of the oxide semiconductor layers 30, 40S, and 40D preferably include at least indium (In) and further at least one or both of gallium (Ga) and zinc (Zn).

The oxide semiconductor layers 30, 40S, and 40D in the embodiment each include $InGaZnO_x$ (IGZO) that is an oxide including indium (In), gallium (Ga), and zinc (Zn).

Moreover, the oxide semiconductor layer 30 includes fluorine (F). Specifically, fluorine is included in a region that is an internal region in the oxide semiconductor layer 30 and is close to the undercoat layer 20. In other words, fluorine is included in a back channel side of the oxide semiconductor layer 30. Specifically, fluorine is included in regions that are internal regions in the oxide semiconductor layers 40S and 40D and are close to the undercoat layer 20. In the embodiment, fluorine that is chemically bonded is included in the oxide semiconductor layers 30, 40S, and 40D. It is to be noted that the regions which are the internal regions in the oxide semiconductor layers 30, 40S, and 40D and are close to the undercoat layer 20 each are a region which is on the side of the undercoat layer 20 and is below at least the middle of a thickness of the oxide semiconductor layers 30, 40S, and 40D.

The oxide semiconductor layer 30 in the embodiment includes a first region (region including fluorine) 31 which is a region including fluorine, and a second region (region including no fluorine) 31 which is a region including no fluorine.

The first region 31 is a first channel layer and a region on the side of the undercoat layer 20 (back channel side) in the oxide semiconductor layer 30. That is to say, in the embodiment, fluorine is included only in the region on the side of the undercoat layer 20 in the oxide semiconductor layer 30. By contrast, the second region 32 is a second channel layer and a region on a side of the gate insulating layer 50 (front channel side) in the oxide semiconductor layer 30. For example, when the middle of the film thickness of the oxide semiconductor layer 30 is a reference point, the first region 31 is a region (lower layer) below the middle of the film thickness of the oxide semiconductor layer 30, and the second region 32 is a region (upper layer) above the middle of the film thickness of the oxide semiconductor layer 30.

Similarly, the oxide semiconductor layers 40S and 40D each include a region on the side of undercoat layer 20 (lower layer) which is a region in which fluorine is included (region including fluorine), and a region on the side of the gate insulating layer 50 (upper layer) which is a region in which no fluorine is included (region including no fluorine).

It is to be noted that the oxide semiconductor layers 40S and 40D each are the region of which resistance is reduced, but since the lower layer, the region including fluorine, includes chemically bonded fluorine, it is considered that the resistance of the lower layer is not reduced much compared to the upper layer, the region including no fluorine.

As just described, a fluorine concentration of the region close to the undercoat layer 20 in each of the oxide semiconductor layers 30, 40S, and 40D is higher than that of the region close to the gate insulating layer 50 in each of the oxide semiconductor layers 30, 40S, 40D.

Moreover, in the embodiment, the region including fluorine (first region 31 etc.) in each of the oxide semiconductor layers 30, 40S, and 40 has a fluorine concentration gradient in a thickness direction. Specifically, in the region including fluorine (first region 31 etc.), a fluorine concentration of the region on the side of the undercoat layer 20 is set to be higher than that of the region on the side opposite the undercoat layer 20 (the side of the gate insulating layer 50). Furthermore, in the embodiment, the fluorine concentration of the region including fluorine (first region 31 etc.) gradually increases toward the undercoat layer 20 from the gate insulating layer 50.

It is to be noted that, in the embodiment, although fluorine is included in part of the region in each of the oxide semiconductor layers 30, 40S, and 40D, fluorine may be included in the whole region of each of the oxide semiconductor layers 30, 40S, and 40D. In short, the upper layer (second region 32 etc.) may not be necessary in each of the oxide semiconductor layers 30, 40S, and 40D.

The lower layer (first region 31 etc.) in each of the oxide semiconductor layers 30, 40S, and 40D has a film thickness of at least 5 nm. The film thickness is preferably at least 15 nm and more preferably at least 20 nm. Moreover, the oxide semiconductor layers 30, 40S, and 40D each preferably have a total film thickness of 20 nm or more. It is to be noted that, in the embodiment, the film thickness of the lower layer in each of the oxide semiconductor layers 30, 40S, and 40D is set to be the same.

Setting the film thickness of the lower layer (first region 31 etc.) in each of the oxide semiconductor layers 30, 40S, and 40D to be at least 5 nm makes it possible to sufficiently exert the aforementioned effects of including fluorine.

Moreover, even when hydrogen diffuses from the outside of the oxide semiconductor layers 30, 40S, and 40D by annealing or the like, setting the film thickness of the lower layer (first region 31 etc.) to be at least 15 nm enables the lower layer including fluorine (first region 31 etc.) in each of the oxide semiconductor layers 30, 40S, 40D to block diffusing hydrogen. In the embodiment, since the lower layer including fluorine (first region 31 etc.) is close to the undercoat layer 20, hydrogen entering the oxide semiconductor layers 30, 40S, and 40D from the undercoat layer 20 can be blocked by the region close to the undercoat layer 20 (first region 31 etc.) in each of the oxide semiconductor layers 30, 40S, and 40D. With this, it is possible to obtain stable thin film transistor characteristics.

Moreover, setting the film thickness of the lower layer (first region 31 etc.) in each of the oxide semiconductor layers 30, 40S, and 40D to be at least 20 nm makes it possible to sufficiently perform process control of the oxide semiconductor layers 30, 40S, and 40D. Stated differently, setting the film thickness of the lower layer (first region 31 etc.) in each of the oxide semiconductor layers 30, 40S, and 40D to be at least 20 nm makes it possible to set the film thickness of the oxide semiconductor layers 30, 40S, and 40D to be at least 20 nm. With this, it is possible to readily perform deposition of the oxide semiconductor layers 30, 40S, and 40D by sputtering or the like, and patterning of the oxide semiconductor layers 30, 40S, and 40D by a photo-lithography or etching method.

Furthermore, a fluorine concentration of each of the oxide semiconductor layers 30, 40S, and 40D is higher than at least a hydrogen concentration of a corresponding one of the oxide semiconductor layers 30, 40S, and 40D. In the embodiment, the fluorine concentration of each of the oxide semiconductor layers 30, 40S, and 40D is set to be $1 \times 10^{22}$ atm/cm$^3$ or more.

The gate insulating layer 50 (insulating layer) is formed at a position opposite the undercoat layer 20 with the oxide semiconductor layer 30 being between the gate insulating layer 50 and the undercoat layer 20. Specifically, the gate insulating layer 50 is formed on the oxide semiconductor layer 30. More specifically, the gate insulating layer 50 is formed in contact with the second region 32 of the oxide semiconductor layer 30. The gate insulating layer 50 is formed only on the oxide semiconductor layer 30 in the embodiment, but the present invention is not limited to this.

The gate insulating layer 50 is a single layer insulating layer of an oxide insulating layer or a nitride insulating layer, or a stacked insulating layer including an oxide insulating layer and a nitride insulating layer. The gate insulating layer 50 is a single layer film of silicon oxide, silicon nitride, silicon oxynitride, tantalum oxide, or aluminum oxide, or stacked films of these. In the embodiment, the gate insulating layer 50 is a stacked film including a silicon oxide film and a silicon nitride film, for example. The film thickness of the insulating layer 50 can be designed by taking into consideration pressure resistance of the TFT or the like, and is preferably set to be from 50 to 500 nm, for example.

The gate electrode 60 is formed at a position opposite the oxide semiconductor layer 30 with the gate insulating layer 50 being between the gate electrode 60 and the oxide semiconductor layer 30. Specifically, the gate electrode 60 is pattern-formed in a predetermined shape, on the gate insulating layer 50. In the embodiment, a channel direction length (gate length) of the gate electrode 60 is the same as a channel direction length of the gate insulating layer 50.

The gate electrode 60 is an electrode having a single layer structure or a multi-layer structure including a conductive material such as metal or an alloy thereof, and may include molybdenum (Mo), aluminum (Al), copper (Cu), tungsten (W), titanium (Ti), chrome (Cr), or molybdenum tungsten (MoW), for example. The film thickness of the gate electrode 60 is preferably set to be from 50 to 300 nm.

The interlayer insulating layer 70 is formed to cover the gate electrode 60 and the oxide semiconductor layers 40S and 40D. The interlayer insulating layer 70 may be made of a material having an organic substance as a main component or may be made of an inorganic substance such as silicon oxide, silicon nitride, silicon oxynitride, and aluminum oxide. In addition, the interlayer insulating layer 70 may be a single layer film or a film having stacked layers.

Moreover, in the interlayer insulating layer 70, openings (contact holes) are formed to penetrate part of the interlayer insulating layer 70. The oxide semiconductor layer 40S is connected to the source electrode 80S, and the oxide semiconductor layer 40D is connected to the drain electrode 80D, via the openings of the interlayer insulating layer 70.

The source electrode 80S and the drain electrode 80D are formed in a predetermined shape, on the interlayer insulating layer 70. Moreover, the source electrode 80S and the drain electrode 80D are each electrically connected to the oxide semiconductor layer 30. In the embodiment, the source electrode 80S and the drain electrode 80D are each electrically and physically connected to a different one of the oxide semiconductor layers 40S and 40D via the openings formed in the interlayer insulating layer 70, and are electrically connected to the oxide semiconductor layer 30 via the oxide semiconductor layers 40S and 40D.

The source electrode 80S and the drain electrode 80D each are an electrode having a single layer structure including an conductive material or an alloy thereof, or a multi-layer structure of these. The source electrode 80S and the drain electrode 80D may include, for example, molybdenum (Mo), aluminum (Al), copper (Cu), tungsten (W), titanium (Ti), chrome (Cr), molybdenum tungsten alloy (MoW), or copper manganese allow (CuMN). The film thickness of each of the source electrode 80S and the drain electrode 80D is preferably set to be from 50 to 300 nm, for example.

[Method for Manufacturing Thin Film Transistor]

Next, the method for manufacturing the thin film transistor 1 according to the embodiment will be described with reference to FIGS. 2A to 2I. FIGS. 2A to 2I are cross-sectional views illustrating processes in the method for manufacturing the thin film transistor according to the embodiment of the present invention.

Figure 2A:
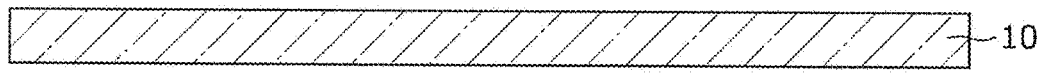
FIG. 2A is a cross-sectional view illustrating a process for preparing a substrate in a method for manufacturing the thin film transistor according to the embodiment.

First, as illustrated by FIG. 2A, the substrate 10 is prepared. A glass substrate is used as the substrate 10, for example.

Figure 2B:
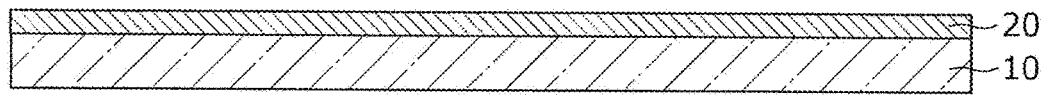
FIG. 2B is a cross-sectional view illustrating a process for forming an undercoat layer in the method for manufacturing the thin film transistor according to the embodiment.

Next, as illustrated by FIG. 2B, the undercoat layer 20 is formed on the substrate 10. For example, the undercoat layer 20 including a silicon nitride film, a silicon oxide film, a silicon oxynitride film, an oxide aluminum film, or the like is formed on the substrate 10 by plasma chemical vapor deposition (CVD) or the like.

Figure 2C:
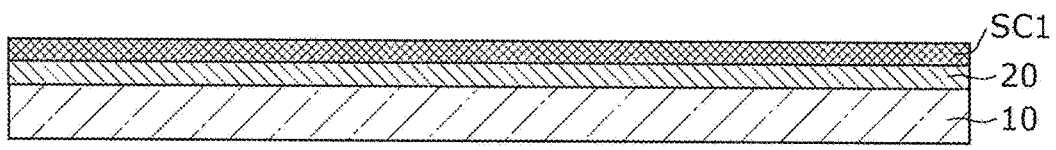
FIG. 2C is a cross-sectional view illustrating a process for depositing a first oxide semiconductor film in the method for manufacturing the thin film transistor according to the embodiment.

Next, as illustrated by FIG. 2C, a first oxide semiconductor film including fluorine is deposited on the undercoat layer 20. The first oxide semiconductor film SC1 may include an InGaZnO$_x$ transparent amorphous oxide semiconductor. In this case, the first oxide semiconductor film (InGaZnO$_x$ film) SC1 including InGaZnO$_x$ can be deposited by a vapor phase deposition method such as a sputtering method and a laser evaporation method.

Specifically, a target material including In, Ga, and Zn (for example, a polycrystalline sintered body having an InGaO$_3$(ZnO)$_4$ composition) is used, an argon (Ar) gas as an inert gas and a gas including oxygen (O$_2$) as a reactive gas are introduced into a vacuum chamber, and voltage of a predetermined power density is applied to the target material.

Here, the first oxide semiconductor film including fluorine (In—Ga—Zn—O:F) SC1 can be deposited by sputtering while introducing fluorine. The introduction (supply) of fluorine into the oxide semiconductor layer can be performed by including fluorine in a target or introducing a process gas including fluorine (NF$_3$ gas, for example).

Specifically, the first oxide semiconductor film SC1 including fluorine can result from depositing the InGaZnO$_x$ film by sputtering using a target material including fluorine. In addition, the first oxide semiconductor film SC1 including fluorine can result from depositing the InGaZnO$_x$ film while introducing the gas including fluorine (NF$_3$ gas, for example). It is to be noted that it is possible to allow the first oxide semiconductor film SC1 to have a fluorine concentration gradient in a thickness direction of the first oxide semiconductor film SC1 by changing an introduction amount of fluorine while the first oxide semiconductor film SC1 is being deposited. For example, it is possible to deposit the first oxide semiconductor film SC1 whose fluorine concentration gradually decreases upward, by gradually reducing an introduction amount of fluorine.

Examples of a method for depositing the first oxide semiconductor film SC1 including fluorine include a method including: applying fluorine to the surface of the undercoat layer 20; depositing an oxide semiconductor layer on the undercoat layer 20; and thermally diffusing fluorine into the oxide semiconductor layer by annealing. It is to be noted that the annealing in this case may be heat treatment (annealing) for stabilizing the oxide semiconductor layer 30, which is to be described later. In short, the annealing for thermal diffusion of fluorine may be simultaneously performed with other annealing.

Another example of the method for depositing the first oxide semiconductor film SC1 including fluorine is a method including depositing an oxide semiconductor layer on the undercoat layer 20 and performing $NF_3$ processing (fluorine processing) on the oxide semiconductor layer. In this case, for example, as the $NF_3$ processing, $NF_3$ plasma processing may be performed at 100 W for 60 seconds.

Figure 2D:
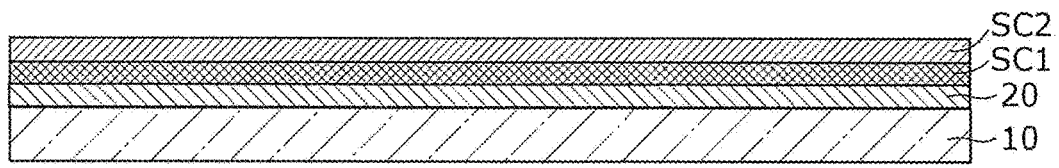
FIG. 2D is a cross-sectional view illustrating a process for depositing a second oxide semiconductor film in the method for manufacturing the thin film transistor according to the embodiment.

Next, as illustrated by FIG. 2D, a second oxide semiconductor film SC2 including no fluorine is deposited on the first oxide semiconductor film SC1. Like the first oxide semiconductor film SC1, the second oxide semiconductor film SC2 may include an $InGaZnO_x$ transparent amorphous oxide semiconductor. Thus, the second oxide semiconductor film ($InGaZnO_x$ film) SC2 including $InGaZnO_x$ can be deposited by a vapor phase deposition method such as a sputtering method and a laser evaporation method.

Specifically, after the first oxide semiconductor film SC1 is deposited, the second oxide semiconductor film (In—Ga—Zn—O) including no fluorine is deposited by sputtering or the like without introducing (supplying) fluorine.

In the embodiment, the first oxide semiconductor film SC1 and the second oxide semiconductor film SC2 are continuously deposited in the same chamber.

An oxide semiconductor stacked film (oxide semiconductor layer) having a laminated structure of the first oxide semiconductor film SC1 and the second oxide semiconductor film SC2 is formed in a predetermined shape by patterning the oxide semiconductor staked film using a photolithography or wet etching method.

Specifically, a resist having a predetermined shape is formed on the second oxide semiconductor film SC2, and part of the oxide semiconductor stacked film in a region where the resist is not formed is removed by wet etching, thereby forming the oxide semiconductor stacked film having an island shape. It is to be noted that when the first oxide semiconductor film SC1 and the second oxide semiconductor film SC2 include $InGaZnO_x$, a chemical solution obtained by mixing, for example, phosphoric acid ($H_3PO_4$), nitric acid ($HNO_3$), acetic acid ($CH_3COOH$), and water may be used as an etching solution.

Figure 2E:
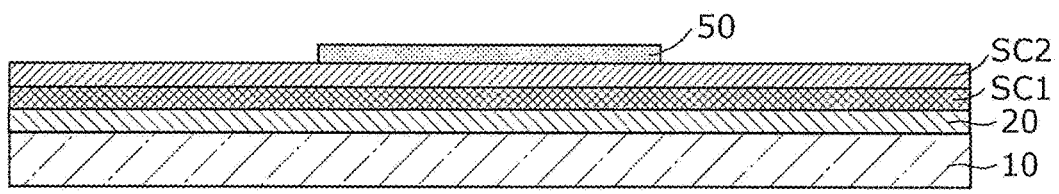
FIG. 2E is a cross-sectional view illustrating a process for forming a gate insulating layer in the method for manufacturing the thin film transistor according to the embodiment.

Next, as illustrated by FIG. 2E, the gate insulating layer 50 is formed on the oxide semiconductor stacked film having the laminated structure of the first oxide semiconductor film SC2 and the second oxide semiconductor film SC2. For example, the gate insulating layer 50 having a predetermined shape is formed on a predetermined region of the second oxide semiconductor film SC2. The gate insulating layer 50 is a silicon nitride film, a silicon oxide film, a silicon oxynitride film, a tantalum oxide film, an oxide aluminum film, or stacked layers of these, for example. In the embodiment, a silicon oxide film is deposited as the gate insulating layer 50 by plasma CVD.

Figure 2F:
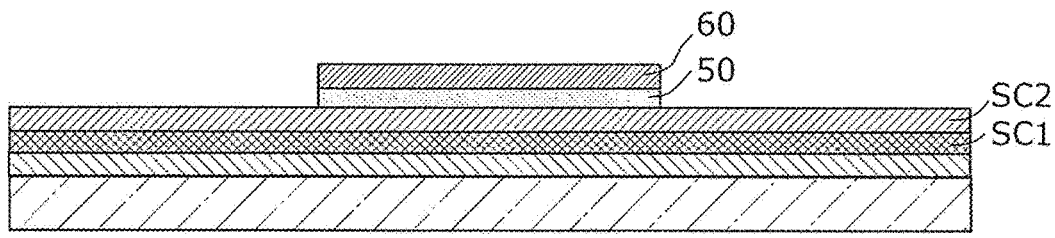
FIG. 2F is a cross-sectional view illustrating a process for forming a gate electrode in the method for manufacturing the thin film transistor according to the embodiment.

Next, as illustrated by FIG. 2F, the gate electrode 60 is formed on the gate electrode 50. In the embodiment, after a metal film (gate metal film) including molybdenum tungsten (MoW) is deposited on the whole surface of the gate insulating layer 50 by sputtering, the gate electrode 60 is formed in a predetermined shape by patterning the metal film using a photolithography or wet etching method. For the wet etching of MoW, a chemical solution can be used which is obtained by mixing, for example, phosphoric acid ($HPO_4$), nitric acid ($HNO_3$), acetic acid ($CH_3COOH$), and water in a predetermined combination ratio.

Figure 2G:
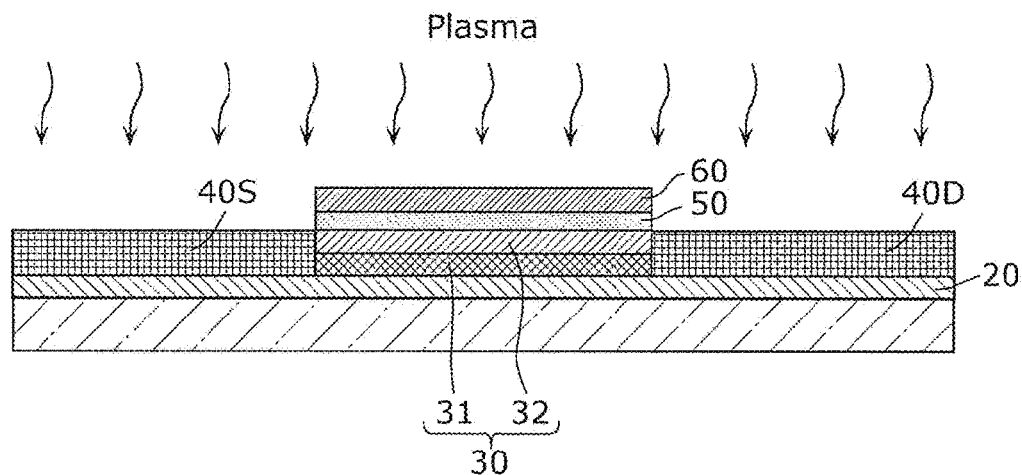
FIG. 2G is a cross-sectional view illustrating a low resistance process for an oxide semiconductor stacked film in the method for manufacturing the thin film transistor according to the embodiment.

Next, as illustrated by FIG. 2G, by performing a process for selectively reducing a resistance value of a predetermined region in the oxide semiconductor stacked film (low resistance processing), which is the stacked film including the first oxide semiconductor film SC1 and the second oxide semiconductor film SC2, the oxide semiconductor stacked film is functionally separated into the oxide semiconductor layer 30 to be the channel layer, the oxide semiconductor layer 40S to be the source region, and the oxide semiconductor layer 40D to be the drain region.

In the embodiment, the oxide semiconductor stacked film part of which the gate electrode 60 is formed on is irradiated with plasma. That is to say, the oxide semiconductor stacked film is irradiated with plasma using the gate electrode 60 as a mask. With this, a portion of the oxide semiconductor stacked film exposed by the gate electrode 60 is irradiated with plasma, and a portion of the oxide semiconductor stacked film not exposed by the gate electrode 60 is not irradiated with plasma. As a result, the low resistance process is selectively performed on only the portion of the oxide semiconductor stacked film irradiated with plasma (portion exposed by the gate electrode 60).

Specifically, a portion of the oxide semiconductor staked film covered by the gate electrode 60 and not irradiated with plasma (central portion) does not undergo the low resistance process and becomes the oxide semiconductor layer 30. The oxide semiconductor layer 30 thus formed is the channel layer and includes the first oxide semiconductor film SC1 including fluorine (first region 31) and the second oxide semiconductor film SC2 including no fluorine (second region 32).

In addition, portions of the oxide semiconductor staked film not covered by the gate electrode 60 and irradiated with plasma (side portions) undergo the low resistance process and become the oxide semiconductor layers 40S and 40D. The oxide semiconductor layers 40S and 40D thus formed are low resistance regions (source region and drain region) including an oxide semiconductor, and each include the first oxide semiconductor film SC1 including fluorine and the second oxide semiconductor film SC2 including no fluorine.

It is to be noted that examples of the plasma irradiation include Ar plasma irradiation and hydrogen plasma irradiation, and it is possible to sufficiently reduce the resistance value of the oxide semiconductor stacked film using such plasma irradiation.

Figure 2H:
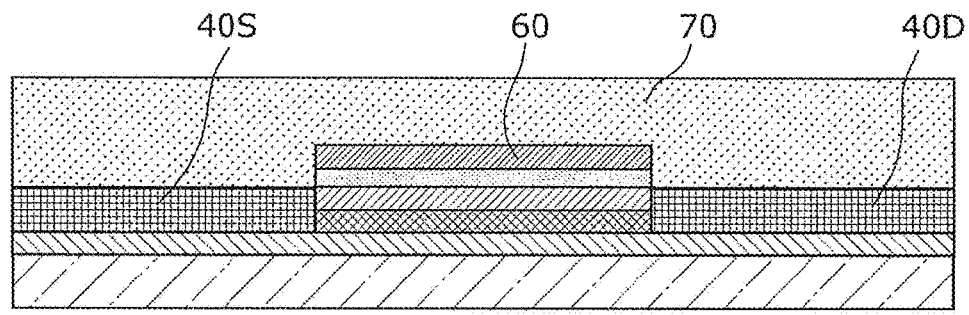
FIG. 2H is a cross-sectional view illustrating a process for forming an interlayer gate insulating layer in the method for manufacturing the thin film transistor according to the embodiment.

Next, as illustrated by FIG. 2H, the interlayer insulating layer 70 is formed to cover the oxide semiconductor layers 40S and 40D and the gate electrode 60. The interlayer insulating layer 70 may include an organic substance as a main component or an inorganic substance such as a silicon oxide film. For example, a silicon oxide film may be deposited as the interlayer insulating layer 70 by plasma CVD Then, the openings (contact holes) are formed in the interlayer insulating layer 70 to expose part of each of the oxide semiconductor layers 40S and 40D. Specifically, part of the interlayer insulating layer 70 is etched away by a photolithography or etching method, thereby forming the openings above connection portions with the source electrode 80S and the drain electrode 80D in the respective oxide semiconductor layers 40S and 40D. For example, when the oxide semiconductor layers 40S and 40D each are a silicon oxide film, the openings can be formed in the silicon oxide film by a dry etching method such as a reactive ion etching (RIE) method. In this case, carbon tetrafluoride ($CF_4$) and oxygen gas ($O_2$), for example, can be used as an etching gas.

Figure 2I:
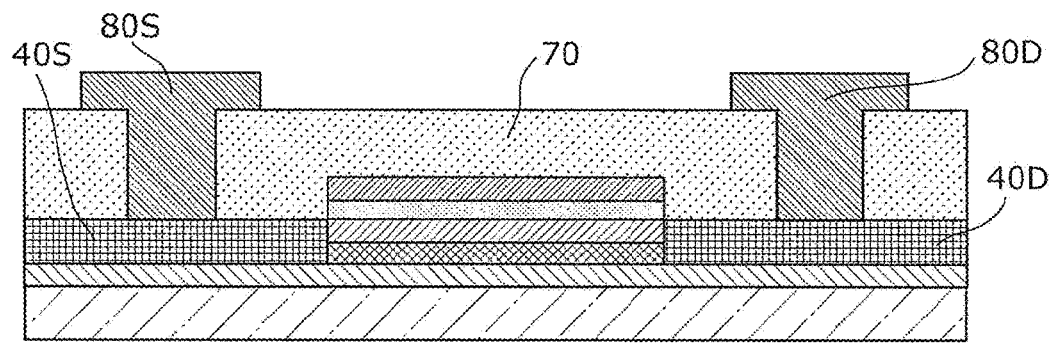
FIG. 2I is a cross-sectional view illustrating a process for forming a source electrode and a drain electrode in the method for manufacturing the thin film transistor according to the embodiment.

Next, as illustrated by FIG. 2I, the source electrode 80S and the drain electrode 80D are formed which are connected to the oxide semiconductor layers 40S and 40D via the openings formed in the interlayer insulating layer 70. In the embodiment, after a metal film (source drain metal film) is deposited on the interlayer insulating layer 70 by sputtering to fill the openings formed in the interlayer insulating layer 70, the metal film is patterned by a photolithography or wet etching method to form the source electrode 80S and the drain electrode 80D having a predetermined shape.

It is to be noted that, though not illustrated, for example, a heat treatment at 300° C. (annealing) is performed subsequently. This heat treatment makes it possible to reduce oxygen deficiency in the oxide semiconductor layer 30 to stabilize characteristics of the oxide semiconductor layer 30.

[Operational Effect of Thin Film Transistor]

The following describes an operational effect of the thin film transistor 1 according to the embodiment together with the background to the present invention.

An undercoat layer may be formed on a surface of a substrate such as a glass substrate when an oxide semiconductor layer is formed, so as to prevent impurities such as metal from diffusing from the substrate. A silicon nitride layer including hydrogen may be used as the undercoat layer.

Moreover, after the oxide semiconductor layer and additionally a display element or the like are formed on a flexible substrate (resin substrate) with the flexible substrate attached onto the glass substrate with an adhesive or the like, a flexible device may be produced by separating the glass substrate using a laser. In this case, as disclosed by PTL 2, there are many examples where an amorphous silicon layer is formed as a separation layer (detachment layer) which absorbs laser light, on the glass substrate, and the glass substrate is separated using hydrogen bubbling from the amorphous silicon layer.

However, the oxide semiconductor layer is extremely sensitive to hydrogen, and thus the oxide semiconductor layer is susceptible to hydrogen from an inorganic layer such as the undercoat layer and the separation layer. For this reason, an oxide semiconductor TFT including the oxide semiconductor layer has a problem in which electrical characteristics of the oxide semiconductor TFT are severely reduced by hydrogen damage of such an inorganic layer.

As disclosed by PTL 3 and NPL 2, it has been previously reported that stability and reliability can be increased by improving an interface between an insulating layer and an oxide semiconductor layer.

For example, NPL 2 has reported that fluorine is compensated in a dangling bond site of In included in an oxide semiconductor layer (IGZO) by improving an interface with the oxide semiconductor layer using a gate insulating layer in which fluorine is included, thereby leading to increase the reliability.

In addition, NPL 2 has reported that the oxide semiconductor layer (IGZO) is measured by secondary ion mass spectrometry (SIMS) to observe no fluorine included in a bulk of IGZO.

After the inventors also actually verified whether fluorine was diffused in an oxide semiconductor layer (IGZO) by heat or the like using an insulating layer in which fluorine is included, they were not able to confirm desorption of fluorine by a thermal desorption method until the temperature reaches 500° C. or higher. This indicates that fluorine has a stable structure in the oxide semiconductor layer, and as shown by NPL 2, it is considered that the gate insulating layer in which fluorine is included merely produces an improvement effect in the interface between the insulating layer and the oxide semiconductor layer.

However, variation in the characteristics or degradation of the reliability of an oxide semiconductor TFT is caused not only by an interface between an insulating layer and an oxide semiconductor layer but also by process damage resulting from hydrogen or the like in a manufacturing process. For example, the aforementioned process damage resulting from hydrogen or the like from the inorganic layer such as the undercoat layer and the separation layer causes the variation in the characteristics or the degradation of the reliability. Therefore, it is not sufficient to merely improve the interface between the insulating layer and the oxide semiconductor layer.

The present invention has been conceived based on such knowledge, and the inventors have arrived at an idea of obtaining a thin film transistor having high reliability by including fluorine in the oxide semiconductor layers 30, 40S, and 40D as described above. In particular, the inventors have found that including fluorine in the oxide semiconductor layers 30, 40S, and 40D makes it possible to achieve a thin film transistor less susceptible to hydrogen from the inorganic layer such as the undercoat layer and the separation layer.

The inventors have conducted various experiments to verify whether a thin film transistor having high reliability is obtained by including fluorine in an oxide semiconductor layer. The following describes the experiments and analyses of the same. It is to be noted that in the following experiments an $InGaZnO_x$ film whose main components of metallic elements are In, Ga, and Zn is used as the oxide semiconductor layer.

Figure 3:
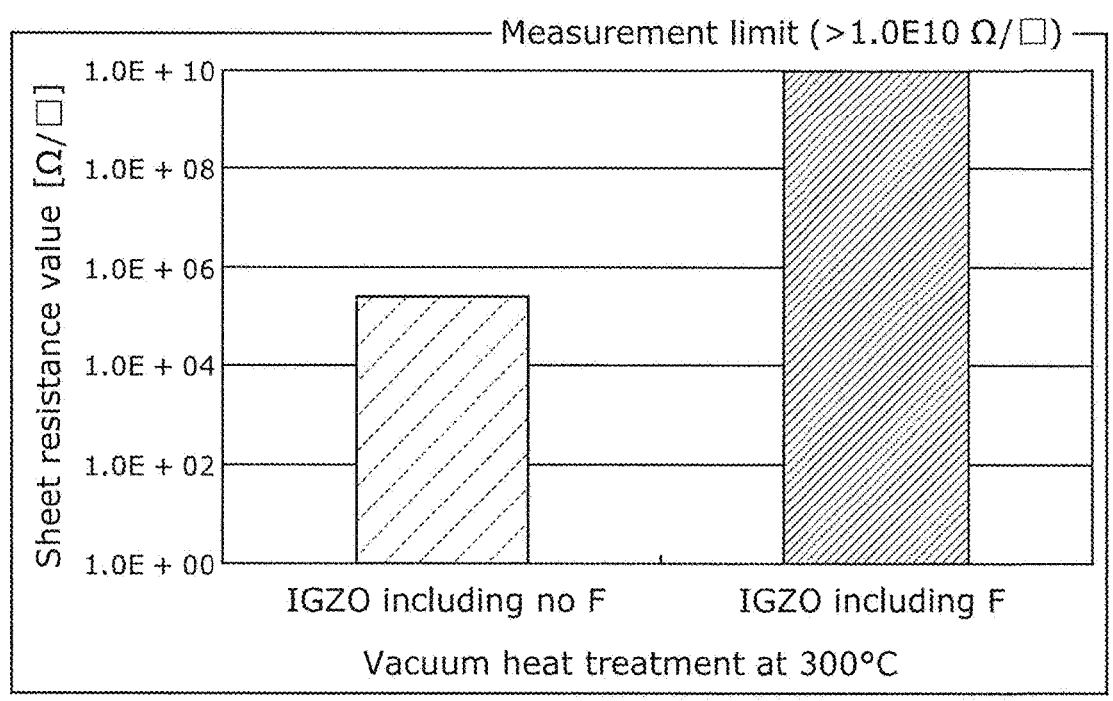
FIG. 3 is a graph illustrating the results of measuring a sheet resistance value in a case where fluorine is included in an oxide semiconductor layer, and a sheet resistance value in a case where fluorine is not included in the oxide semiconductor layer.

First, a point that oxygen deficiency can be compensated by including fluorine in the oxide semiconductor layer will be described with reference to FIG. 3. FIG. 3 illustrates the results of measuring, using four-terminal sensing, a sheet value in vacuum heating (300° C.) for a case where fluorine is included in an oxide semiconductor layer and a case where fluorine is not included in the oxide semiconductor layer.

Charge carriers are generated by oxygen deficiency (desorption of oxygen) to decrease a resistance value of the oxide semiconductor layer. As illustrated by FIG. 3, a sheet resistance value in the case where fluorine is not included in the oxide semiconductor layer (IGZO including no F) is low such as approximately $1 \times 10^5$ Ω/□.

By contrast, a sheet resistance value in the case where fluorine is included in the oxide semiconductor layer (IGZO including F) is a measurement limit (>$1 \times 10^{10}$ Ω/□) and is higher than the sheet resistance value in the case fluorine is not included in the oxide semiconductor layer.

This is because, since fluorine has higher binding energy with metal than oxygen, including fluorine in the oxide semiconductor layer enables fluorine to eliminate dangling bonds or an unstable site caused by the oxygen deficiency in the oxide semiconductor layer.

It is clear from these results that including fluorine in the oxide semiconductor layer results in a structure in which charge carriers are less likely to be generated, that is, a structure which compensates the oxygen deficiency to be insensitive to the oxygen deficiency.

Next, a point that hydrogen resistance can be improved by including fluorine in the oxide semiconductor layer will be described with reference to FIGS. 4 to 6.

Figure 4:
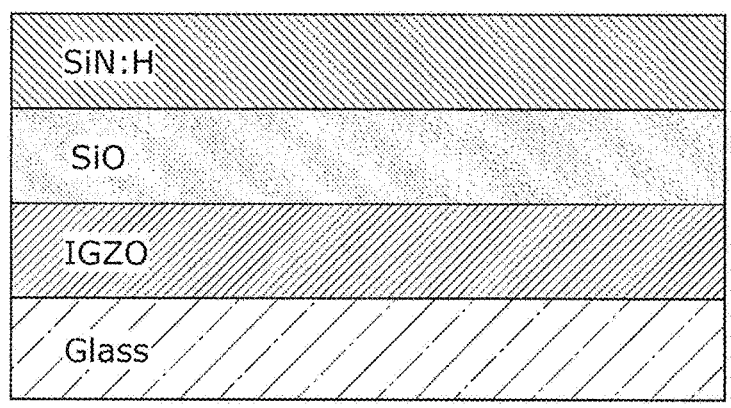
FIG. 4 is a cross-sectional view illustrating a device structure of a sample used in an experiment for hydrogen resistance.

FIG. 4 is a cross-sectional view illustrating a device structure of a sample used in this experiment. As illustrated by FIG. 4, in the experiment, a sample is used which has a three layer structure in which an oxide semiconductor layer (IGZO), a silicon oxide layer (SiO), and a silicon nitride layer (SiN:H) including hydrogen are stacked above a glass substrate.

Figure 5:
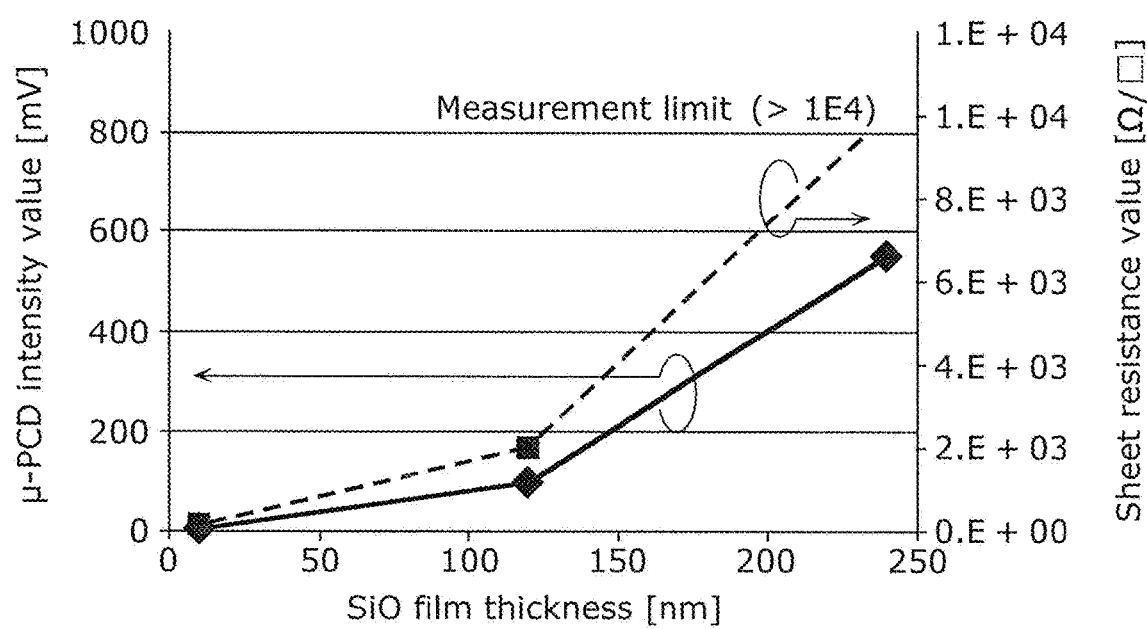
FIG. 5 is a graph illustrating, for the sample having the structure illustrated by FIG. 4, μ-PCD peak intensity and a resistance value of the oxide semiconductor layer when a film thickness of the silicon oxide layer is varied.

FIG. 5 is a graph illustrating, for the sample having the structure illustrated by FIG. 4, μ-PCD peak intensity and a resistance value of the oxide semiconductor layer when the film thickness of the silicon oxide layer is varied. It is to be noted that the film thickness of the silicon oxide layer is varied to 10 nm, 120 nm, and 240 nm. Moreover, the resistance value of the oxide semiconductor layer is measured by a non-contact resistance measurement device.

As illustrated by FIG. 5, it is clear that there is a positive correlation between the resistance value of the oxide semiconductor layer (IGZO) and the μ-PCD peak intensity. In other words, it is clear that the resistance value of the oxide semiconductor layer (IGZO) and the μ-PCD peak intensity give an indication of determining hydrogen-induced damage due to the presence or absence of fluorine introduction.

Figure 6:
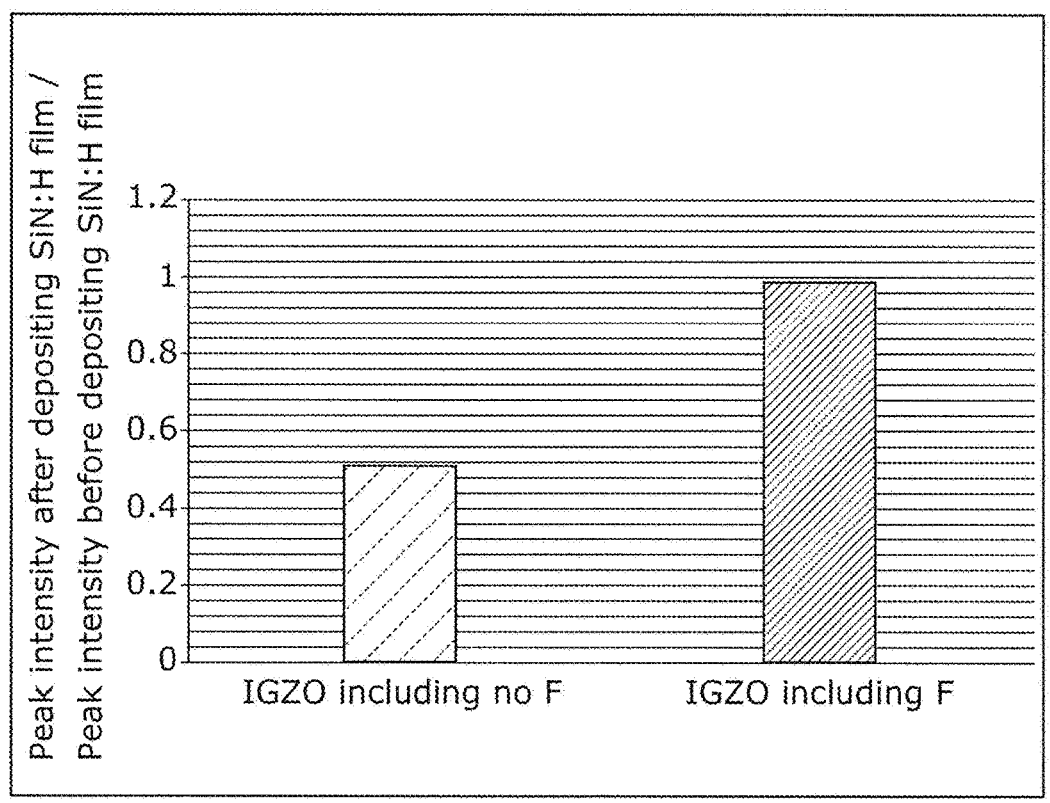
FIG. 6 is a graph illustrating the results of comparing μ-PCD peak intensity and the presence or absence of fluorine introduction to an oxide semiconductor layer.

FIG. 6 is a graph illustrating the results of comparing μ-PCD peak intensity and the presence or absence of fluorine introduction into an oxide semiconductor layer.

As illustrated by FIG. 6, it is clear that if fluorine is not included in the oxide semiconductor layer, a μ-PCD intensity value (a ratio of a peak intensity value before depositing SiN:H film to a peak intensity value after depositing SiN:H film) in the oxide semiconductor layer decreases. In other words, it is clear that a resistance value barely varies even if fluorine is introduced when the resistance value is low, that is, the resistance value does not decrease.

In general, if hydrogen is included in an oxide semiconductor layer, the included hydrogen bonds with oxygen in the oxide semiconductor layer to generate charge carriers.

In view of, even if hydrogen is included in the oxide semiconductor layer, including fluorine in the oxide semiconductor layer and bonding fluorine with the oxide semiconductor layer prevent the included hydrogen from bonding with the oxide semiconductor layer. It is presumed that since fluorine has one valence arm, there is no valence arm available even if hydrogen enters and hydrogen is inert. As just described, including fluorine in the oxide semiconductor layer can prevent the generation of the charge carriers in the oxide semiconductor layer. In short, including fluorine in the oxide semiconductor layer makes it possible to improve the hydrogen resistance.

Next, a point that a structure of the oxide semiconductor layer is stabilized by including fluorine in the oxide semiconductor layer will be described with reference to FIGS. 7A to 7C and FIG. 8.

Figure 7A:
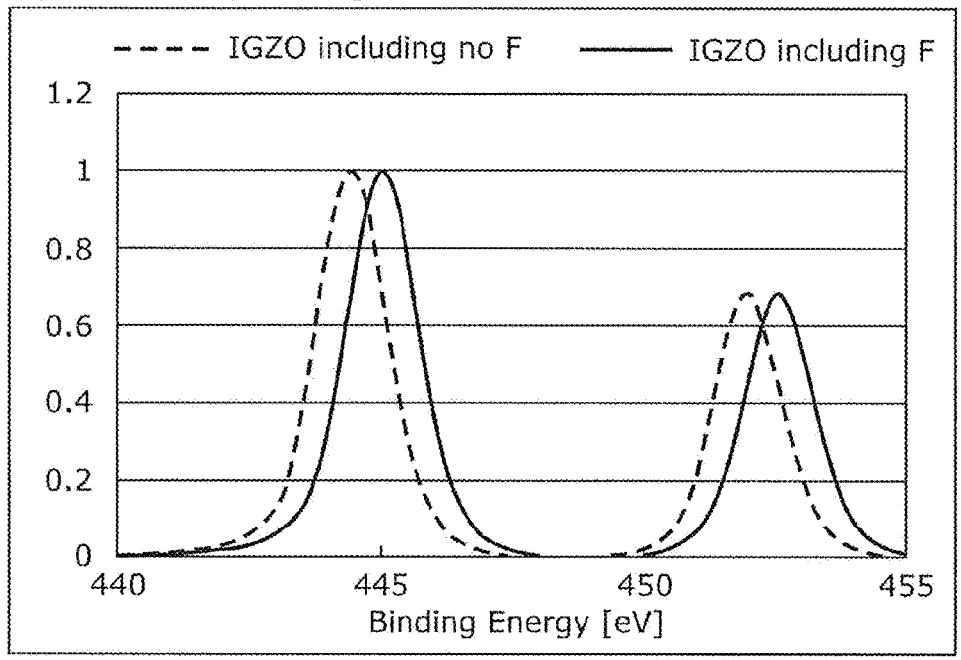
FIG. 7A is a graph illustrating an In3d5 XPS spectrum in a case where fluorine is included in an oxide semiconductor layer, and an In3d5 XPS spectrum in a case where fluorine is not included in the oxide semiconductor layer.
Figure 7B:
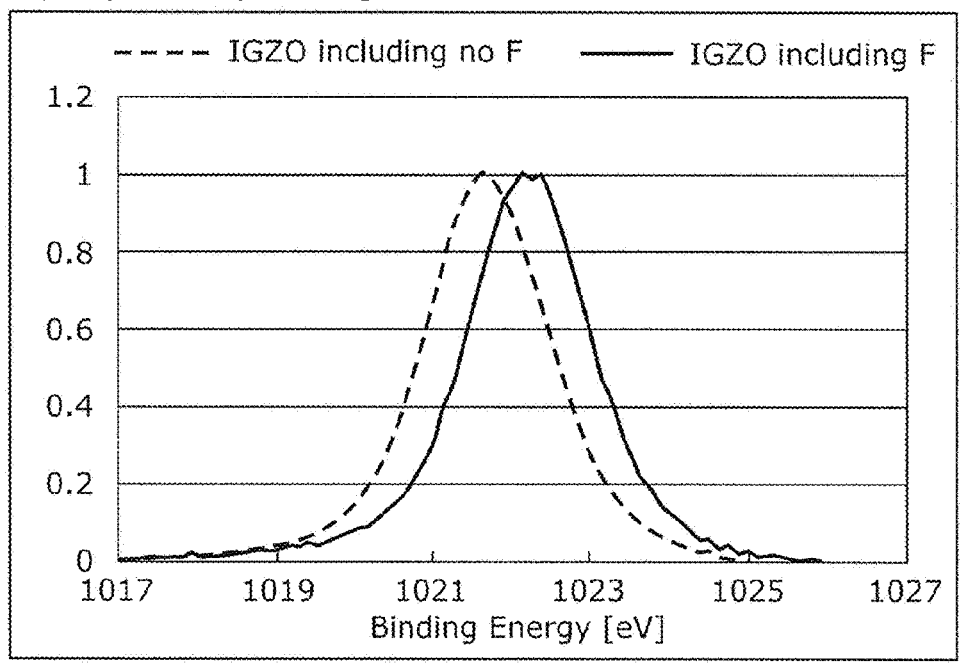
FIG. 7B is a graph illustrating a Zn2p3 XPS spectrum in a case where fluorine is included in an oxide semiconductor layer, and a Zn2p3 XPS spectrum in a case where fluorine is not included in the oxide semiconductor layer.
Figure 7C:
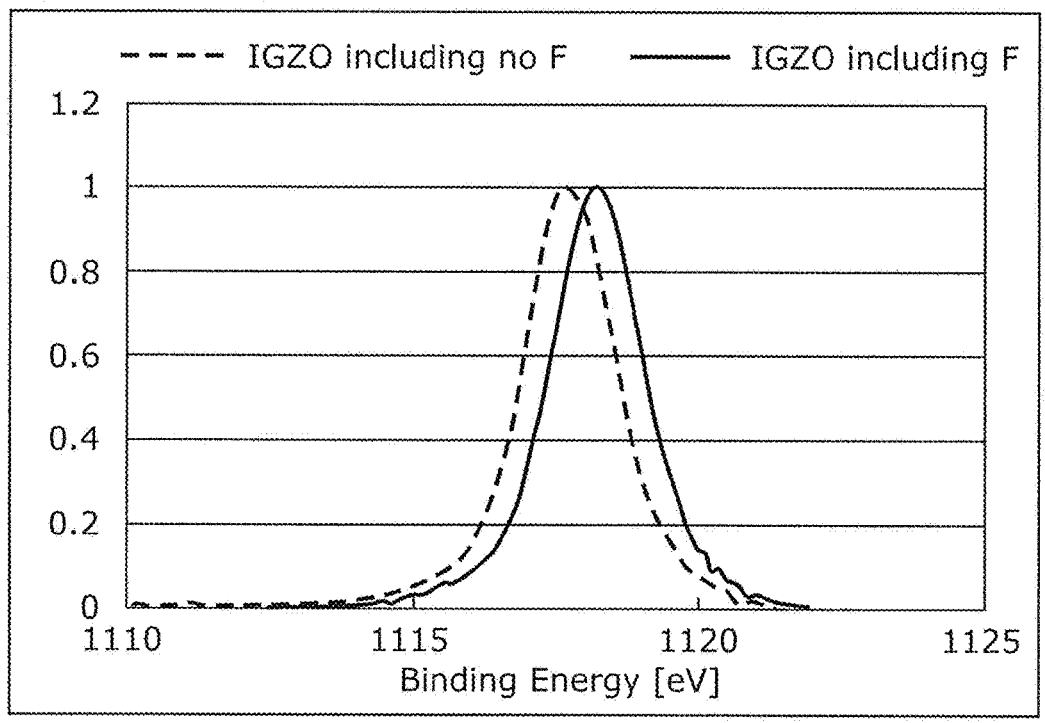
FIG. 7C is a graph illustrating a Ga2p3 XPS spectrum in a case where fluorine is included in an oxide semiconductor layer, and a Ga2p3 XPS spectrum in a case where fluorine is not included in the oxide semiconductor layer.

FIGS. 7A to 7C each illustrate a corresponding one of In3d5, Zn1p3, and Ga2p3 XPS spectra in a case where fluorine is included in an oxide semiconductor layer (IGZO) (IGZO including F) and a corresponding one of In3d5, Zn1p3, and Ga2p3 XPS spectra in a case where fluorine is not included in an oxide semiconductor layer (IGZO) (IGZO including no F).

As illustrated by FIG. 7A, the inclusion of fluorine causes a peak position of the In3d5 XPS spectrum to shift to a high binding energy side by at least 0.5 eV. In other words, a peak position of In3d5 in IGZO including F measured by XPS is shifted to the high binding energy side by at least 0.5 eV in comparison to a peak position of In3d5 in IGZO including no F.

Moreover, as illustrated by FIG. 7B, the inclusion of fluorine causes a peak position of the Zn2p3 XPS spectrum to shift to a high binding energy side by at least 0.4 eV. In other words, a peak position of Zn2p3 in IGZO including F measured by XPS is shifted to the high binding energy side by at least 0.4 eV in comparison to a peak position of Zn2p3 in IGZO including no F.

Furthermore, as illustrated by FIG. 7C, the inclusion of fluorine causes a peak position of the Ga2p3 XPS spectrum to shift to a high binding energy side by at least 0.5 eV. In other words, a peak position of Ga2p3 in IGZO including F measured by XPS is shifted to the high binding energy side by at least 0.5 eV in comparison to a peak position of Ga2p3 in IGZO including no F.

It is clear from the results shown in FIGS. 7A to 7C that including fluorine in the oxide semiconductor layer results in not merely being physically in the oxide semiconductor layer but in being chemically bonded with elements included in the oxide semiconductor layer. Consequently, the metallic elements included in the oxide semiconductor layer are less likely to escape.

As just described, including fluorine in the oxide semiconductor layer results in the metallic elements included in the oxide semiconductor layer being chemically bonded with fluorine, which makes it possible to stabilize the structure of the oxide semiconductor layer. With this, it is possible to obtain a thin film transistor having high reliability.

Figure 8:
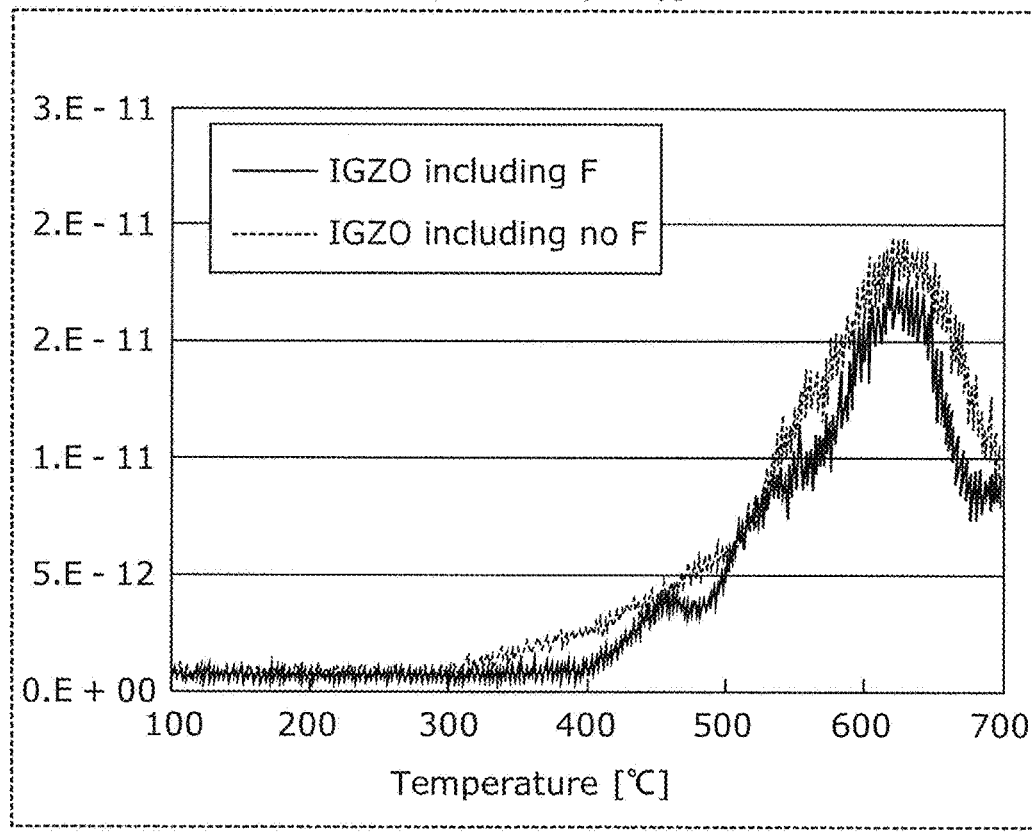
FIG. 8 is a graph illustrating a Zn thermal desorption spectrum by TDS in a case where fluorine is included in an oxide semiconductor layer, and a Zn thermal desorption spectrum by TDS in a case where fluorine is not included in the oxide semiconductor layer.

FIG. 8 illustrates a Zn thermal desorption spectrum by thermal desorption spectrometry (TDS) in a case where fluorine is included in the oxide semiconductor layer (IGZO) (IGZO including F) and a Zn thermal desorption spectrum by TDS in a case where fluorine is not included therein (IGZO including no F). It is to be noted that in FIG. 8 the oxide semiconductor layer in the case where fluorine is included therein has a fluorine concentration of $1 \times 10^{22}$ atm/cm$^3$ or more. Moreover, in FIG. 8, the horizontal axis indicates a temperature (° C.) at which Zn undergoes thermal desorption, and the vertical axis indicates an amount of Zn undergoing thermal desorption (arbitrary unit).

As illustrated by FIG. 8, it is clear that the thermal desorption of Zn in the oxide semiconductor layer (IGZO including F) in the case where fluorine is included therein occurs at a temperature higher by at least 50° C. in comparison to the thermal desorption of Zn in the oxide semiconductor layer (IGZO including no F) in the case where fluorine is not included therein. In other words, it is clear that including fluorine in the oxide semiconductor layer 50 so that the fluorine concentration is at least $1 \times 10^{22}$ atm/cm$^3$ causes the temperature (thermal desorption temperature) at which Zn undergoes the thermal desorption to increase by 50° C.

This is because oxygen desorbs from Zn—O bonds to destabilize Zn, which causes the desorption of Zn. A thermal desorption temperature can be used as a physical property index of an oxide semiconductor layer, and an increase in the thermal desorption temperature indicates that a structure of the oxide semiconductor layer is stabilized.

As just described, also from the standpoint of the thermal desorption temperature of Zn, including fluorine in the oxide semiconductor layer results in the metallic elements included in the oxide semiconductor layer being chemically bonded with fluorine, which makes it possible to stabilize the structure of the oxide semiconductor layer.

Fluorine is included in the oxide semiconductor layers 30, 40S, and 40D in the thin film transistor 1 according to the embodiment. In the embodiment, especially, fluorine is included in the regions that are the internal regions in the oxide semiconductor layers 30, 40S, and 40D and are close to the undercoat layer 20.

With this, as mentioned above, not only the oxygen deficiency in each of the oxide semiconductor layers 30, 40S, and 40D can be compensated, but also the hydrogen resistance of the oxide semiconductor layers 30, 40S, and 40D can be improved, and further the structure of each of the oxide semiconductor layers 30, 40S, and 40D can be stabilized. Therefore, it is possible to achieve the thin-film transistor 1 having high reliability and high robustness.

As just described, a fluorine concentration of the region close to the undercoat layer 20 in each of the oxide semiconductor layers 30, 40S, and 40D is higher than that of the region close to the gate insulating layer 50 in each of the oxide semiconductor layers 30, 40S, and 40D.

With this, in the oxide semiconductor layers 30, 40S, and 40D, the regions (back channel regions) on the side of the substrate 10 (side of the undercoat layer 20) susceptible to the hydrogen damage have the high fluorine concentration, and thus the hydrogen damage on the oxide semiconductor layers 30, 40S, and 40D can be effectively reduced by fluorine. To put it differently, it is possible to improve the hydrogen resistance to hydrogen entering from the undercoat layer 20.

By contrast, in the oxide semiconductor layers 30, 40S, and 40D, the regions (front channel regions) on the side of the gate electrode 60 have the low fluorine concentration and are less susceptible to an increase in resistance due to fluorine. Thus, it is possible to maintain a high on-state current in the oxide semiconductor layers as before. In addition, the resistance of the front channel region of the oxide semiconductor layer 30 is not increased, and thus it is easy to make contact with the oxide semiconductor layers 40S and 40D (source region and drain region).

For these reasons, in the oxide semiconductor layers 30, 40S, and 40D, upper layers on the side of the gate insulating layer 50 (second region 32 etc.) preferably include no fluorine (have a zero fluorine concentration).

Moreover, in the embodiment, the region including fluorine in each of the oxide semiconductor layers 30, 40S, and 40 has the fluorine concentration gradient in the thickness direction.

With this, it is possible to effectively exert the effects of including fluorine. For example, by setting the fluorine concentration of the region, in the region including fluorine, on the side of the gate insulating layer 50 to be low, and the fluorine concentration of the region in the undercoat layer 20 to be high, it is possible to maintain the effects of including fluorine and achieve a thin film transistor having superior TFT characteristics.

[Display Device]

Figure 9:
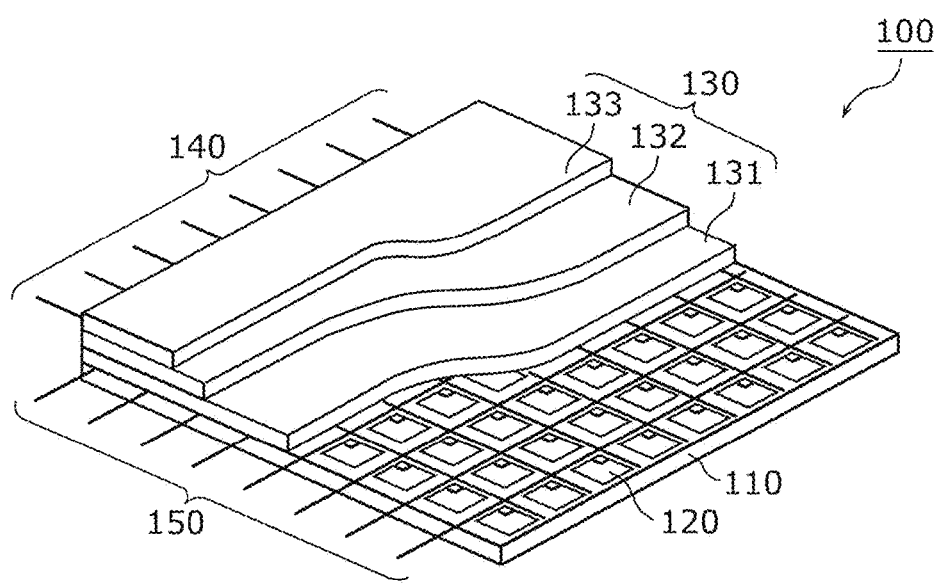
FIG. 9 is a cutaway perspective view illustrating part of an organic EL display device according to the embodiment.
Figure 10:
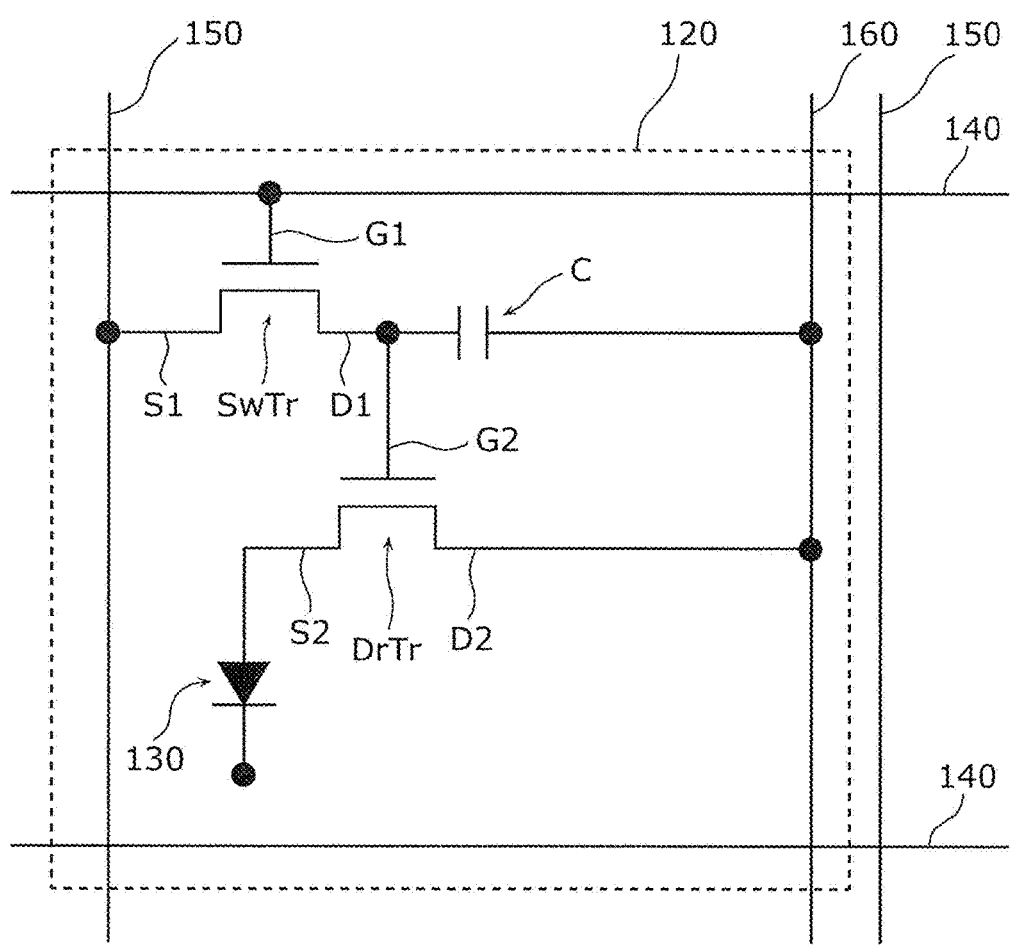
FIG. 10 is an electric circuit diagram illustrating a pixel circuit of the organic EL display device illustrated by FIG. 9.

The following describes an example where the thin-film transistor 1 according to the embodiment is applied to a display device, with reference to FIGS. 9 and 10. It is to be noted that an example of application to an organic EL display device will be described in the embodiment.

FIG. 9 is a cutaway perspective view illustrating part of an organic EL display device according to the embodiment. FIG. 10 is an electric circuit diagram illustrating a pixel circuit of the organic EL display device illustrated by FIG. 9. It is to be noted that the pixel circuit is not limited to the configuration illustrated by FIG. 10.

The above-mentioned thin film transistor 1 can be used as a switching transistor SwTr and a driving transistor DrTr of an active matrix substrate in the organic EL display device.

As illustrated by FIG. 9, an organic EL display device 100 includes a stacked structure of: a TFT substrate (TFT array substrate) 110 in which thin-film transistors are disposed; and organic EL elements (light-emitting units) 130 each including an anode 131 which is a lower electrode (reflecting electrode), and a cathode 133 which is an EL layer (light-emitting layer) 132 and an upper electrode (transparent electrode).

The TFT substrate 110 in the embodiment includes the above-mentioned thin film transistor 1. Pixels 120 are arranged in a matrix in the TFT substrate 110, and a pixel circuit is included in each pixel 120.

Each of the organic EL elements 130 is formed corresponding to a different one of the pixels 120, and light emission of the organic EL element 130 is controlled by the pixel circuit included in the corresponding pixel 120. Each organic EL element 130 is formed on an interlayer insulating layer (planarizing layer) formed to cover thin film transistors.

Moreover, the organic EL element 130 has a configuration in which the EL layer 132 is disposed between the anode 131 and the cathode 133. Furthermore, a hole transport layer is formed stacked between the anode 131 and the EL layer 132, and an electron transport layer is formed stacked between the EL layer 132 and the cathode 133. It is to be noted that other function layers may be formed between the anode 131 and the cathode 133. In addition to the EL layer 132, a function layer to be formed between the anode 131 and the cathode 133 is an organic layer including an organic material.

Each pixel 120 is driven and controlled by a corresponding one of the pixel circuits. Moreover, in the TFT substrate 110, gate lines (scanning lines) 140 are disposed along the row direction of the pixels 120, source lines (signal lines) 150 are disposed along the column direction of the pixels 120 to cross the gate lines 140, and power supply lines (not illustrated in FIG. 9) are disposed parallel to the source lines 150. The pixels 120 are partitioned from one another by, for example, the crossing gate lines 140 and source lines 150.

The gate lines 140 are connected, on a row by row basis, to the gate electrodes of the switching transistors included in the respective pixel circuits. The source lines 150 are connected, on a column by column basis, to the source electrodes of the switching transistors. The power supply lines are connected, on a column by column basis, to the drain electrodes of the driving transistors included in the respective pixel circuits.

As illustrated by FIG. 10, the pixel circuit includes the switching transistor SwTr, the driving transistor DrTr, and a capacitor C which stores data to be displayed by a corresponding one of the pixels 120. In the embodiment, the switching transistor SwTr is a TFT for selecting the pixel 120, and the driving transistor DrTr is a TFT for driving the organic EL element 130.

The switching transistor SwTr includes: a gate electrode G1 connected to the gate line 140; a source electrode S1 connected to the source line 150; a drain electrode D1 connected to the capacitor C and a gate electrode G2 of a second thin film transistor DrTr; and an oxide semiconductor layer (not illustrated). When a predetermined voltage is applied to the gate line 140 and the source line 150 connected to the switching transistor SwTr, the voltage applied to the source line 150 is held as data voltage in the capacitor C.

The driving transistor DrTr includes: the gate electrode G2 connected to the drain electrode D1 of the switching transistor SwTr and the capacitor C; a drain electrode D2 connected to the power supply line 160 and the capacitor C; a source electrode S2 connected to the anode 131 of the organic EL element 130; and an oxide semiconductor layer (not illustrated). The driving transistor DrTr supplies current corresponding to data voltage held in the capacitor C from the power supply line 160 to the anode 131 of the organic EL element 130 via the source electrode S2. With this, in the organic EL element 130, drive current flows from the anode 131 to the cathode 133, which causes the EL layer 132 to emit light.

It is to be noted that the organic EL display device 100 having the above-described configuration uses an active-matrix system in which display control is performed for each pixel 120 at a cross-point between the gate line 140 and the source line 150. With this, the switching transistor SwTr and the driving transistor DrTr in each pixel 120 cause the corresponding organic EL element 130 to selectively emit light, and thus a desired image is displayed.

As above, the organic EL display device 100 in the embodiment uses, as the switching transistor SwTr and the driving transistor DrTr, the thin film transistor 1 having high reliability and high robustness, and thus it is possible to achieve an organic EL display device having superior reliability. In particular, the thin film transistor 1 is used as the driving transistor DrTr driving the organic EL element 130, and thus it is possible to achieve an organic EL display device having superior display performance.

(Variation)

Figure 11:
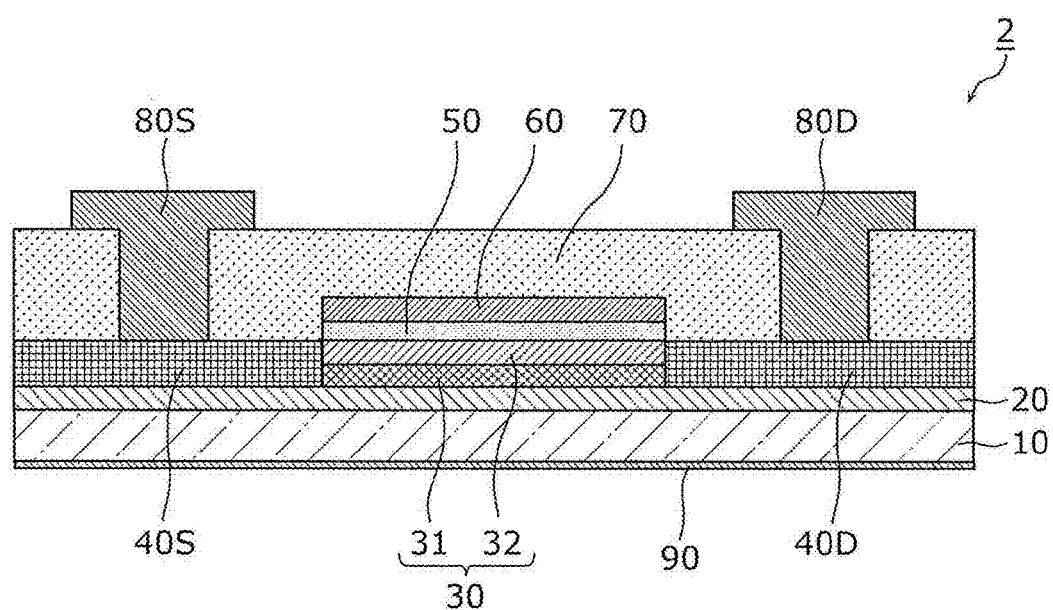
FIG. 11 is a cross-sectional view illustrating a structure of a thin film transistor according to a variation of the embodiment.
Figure 12A:
FIG. 12A is a cross-sectional view illustrating a process for forming a separation layer in a method for manufacturing a thin film transistor according to the variation of the embodiment.
Figure 12B:
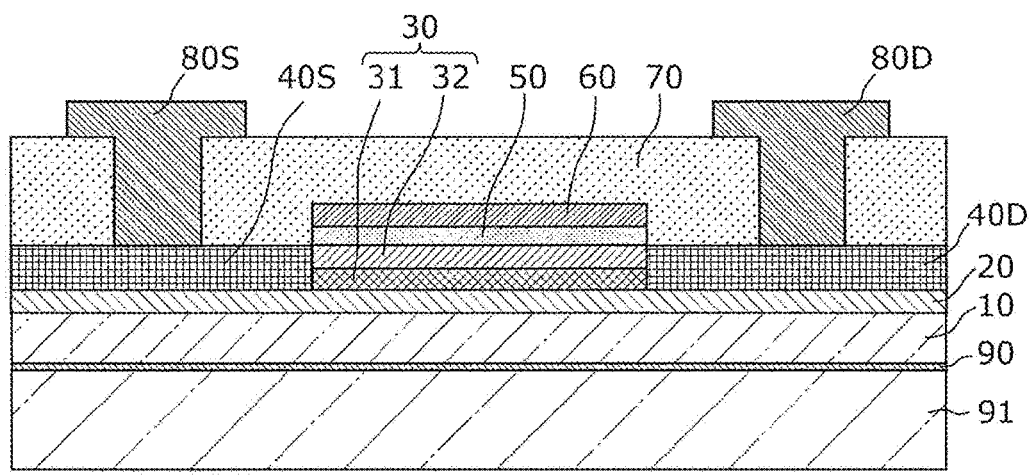
FIG. 12B is a cross-sectional view illustrating a structure of a thin film transistor before a glass substrate is separated, in the method for manufacturing the thin film transistor according to the variation of the embodiment.
Figure 12C:
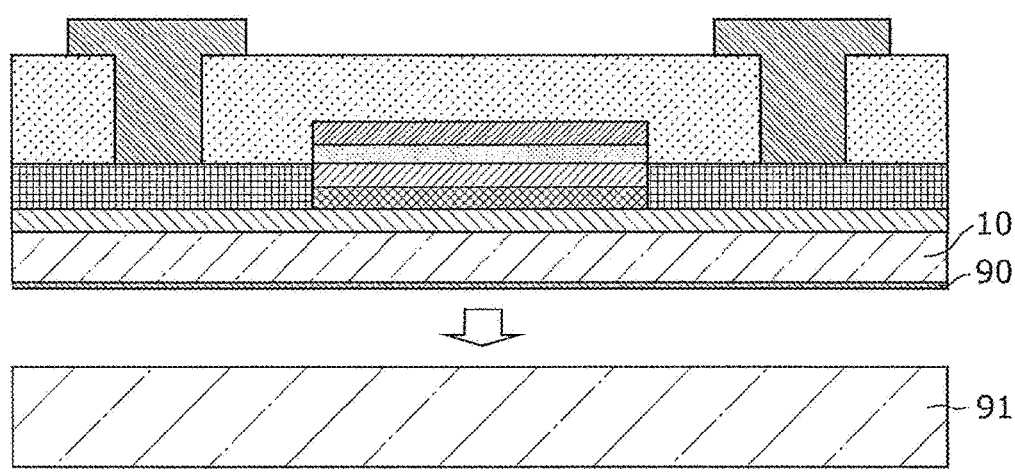
FIG. 12C is a cross-sectional view illustrating a process for separating the glass substrate in the method for manufacturing the thin film transistor according to the variation of the embodiment.

Next, a method for manufacturing a thin film transistor 2 according to a variation of the embodiment will be described with reference to FIGS. 11 and 12A to 12C. FIG. 11 is a cross-sectional view illustrating a structure of a thin film transistor according to the variation of the embodiment. FIGS. 12A to 12C are cross-sectional views illustrating major processes in the method for manufacturing the thin film transistor according to the variation of the embodiment.

As illustrated by FIG. 11, the thin film transistor 2 in the variation is obtained by further disposing, as an inorganic layer, a separation layer 90 below the substrate 10 in the thin film transistor 1 in the aforementioned embodiment. The separation layer 90 in the variation is a layer (amorphous silicon layer) including amorphous silicon as a main component, and is formed on an under surface of the substrate 10.

The thin film transistor 2 having such a structure is often used when a flexible substrate (resin substrate) is used as the substrate 10, and can be manufactured as follows, for example.

In this case, first, as illustrated by FIG. 12A, an amorphous silicon layer is formed as the separation layer 90 on a glass substrate 91.

Next, as illustrated by FIG. 12B, the substrate 10 is attached onto the separation layer 90 with an adhesive or the like. Then, just like the aforementioned embodiment, all the other processes are performed until the source electrode 80S and the drain electrode 80D are formed. As just described, even when the flexible substrate is used as the substrate 10, it is possible to easily form a thin film transistor by forming an oxide semiconductor layer or the like on the substrate 10 while the substrate 10 remains attached to the glass substrate 91.

Next, as illustrated by FIG. 12C, the glass substrate 91 is separated by being irradiated with laser light. Specifically, when the separation layer 90 is irradiated with the laser light, the separation layer 90 absorbs the laser light, and hydrogen bubbling occurs in the amorphous silicon layer. This hydrogen bubbling separates the glass substrate 91 from the substrate 10. With this, it is possible to obtain the thin film transistor 2.

As just described, hydrogen is generated in the separation layer 90 (amorphous silicon layer) in the variation. For this reason, hydrogen from the separation layer 90 passes the substrate 10 to enter the oxide semiconductor layers 30, 40S, and 40D. Consequently, if regions including fluorine are not in the oxide semiconductor layers 30, 40S, and 40D, the oxide semiconductor layers 30, 40S, and 40D would suffer hydrogen damage.

In the variation, fluorine is included in regions that are internal regions in the oxide semiconductor layers 30, 40S, and 40D and are close to the separation layer 90. With this, the same effects as the aforementioned embodiment can be obtained. Stated differently, the variation allows the thin film transistor to be less susceptible to the hydrogen damage resulting from the separation layer 90, and the structure of each of the oxide semiconductor layers 30, 40S, and 40D to be stabilized. With this, it is possible to achieve a thin film transistor having high reliability and high robustness.

It is to be noted that the undercoat layer 20 may not be formed in the variation. In addition, the thin film transistor 2 in the variation may be applied to the aforementioned organic EL display device 100.

[Other Variations etc.]

As shown above, a thin film transistor and a method for manufacturing the same have been described based on the aforementioned embodiment and variation, but the present invention is not limited to these.

For example, the amorphous oxide semiconductor of $InGaZnO_x$ (IGZO) is used as the oxide semiconductor for use in the oxide semiconductor layer in the aforementioned embodiment and variation, but the present invention is not limited to this. An oxide semiconductor including In such as a polycrystalline oxide semiconductor like InGaO can be used.

Moreover, the aforementioned embodiment and variation have described the organic EL display device as the display device including the thin film transistor, but the present invention is not limited to this. For example, the thin film transistor according to the aforementioned embodiment and variation can be applied to another display device such as a liquid crystal display device.

In this case, the organic EL display device (organic EL panel) can be used as a flat panel display. For example, the organic EL display device can be used as a display panel of any electronic device such as a television set, a personal computer, and a cellular phone.

Moreover, the scope of the present invention includes an embodiment obtained by adding various modifications to each embodiment or variation that may be conceived by those skilled in the art or an embodiment obtained by arbitrarily combining components and functions of the embodiment or variation without departing from the spirit of the present invention.

INDUSTRIAL APPLICABILITY

The thin film transistor according to the present invention can be widely used in a variety of electric equipment including the thin film transistor, such as display devices (display panels) like organic EL display devices, television sets, personal computers, and cellular phones.

REFERENCE SIGNS LIST 1, 2 thin film transistor
10 substrate
20 undercoat layer
30, 40S, 40D oxide semiconductor layer
31 first region
32 second region
50 gate insulating layer
60, G1, G2 gate electrode
70 interlayer insulating layer
80S, S1, S2 source region
80D, D1, D2 drain region
90 separation layer
91 glass substrate
100 organic EL display device
110 TFT substrate
120 pixel
130 organic EL element
131 anode
132 EL layer
133 cathode
140 gate line
150 source line
160 power supply line
SC1 first oxide semiconductor film
SC2 second oxide semiconductor film
SwTr switching transistor
DrTr driving transistor
C capacitor

The invention claimed is:

1. A thin film transistor comprising:
   a substrate;
   an inorganic layer disposed on the substrate;
   an oxide semiconductor layer formed above the inorganic layer and including at least indium, wherein the oxide semiconductor layer comprises:
      a first region containing fluorine, and
      a second region free of fluorine, wherein the first region is between the second region and the inorganic layer;
   an insulating layer located opposite the inorganic layer with the oxide semiconductor layer being between the insulating layer and the inorganic layer;
   a gate electrode located opposite the oxide semiconductor layer with the insulating layer being between the gate electrode and the oxide semiconductor layer; and
   a source electrode and a drain electrode electrically connected to the oxide semiconductor layer.

2. The thin film transistor according to claim 1, wherein the inorganic layer is an undercoat layer including silicon oxide or silicon oxynitride and is formed on a top surface of the substrate.

3. The thin film transistor according to claim 2, wherein the inorganic layer is formed by stacking insulating films.

4. The thin film transistor according to claim 1, wherein the inorganic layer is a layer including amorphous silicon as a main component and is formed on an under surface of the substrate.

5. The thin film transistor according to claim 1, wherein a fluorine concentration of the first region closer to the inorganic layer in the oxide semiconductor layer is higher than a fluorine concentration of the first region close to the second region.

6. The thin film transistor according to claim 1, wherein the first region has a fluorine concentration gradient in a thickness direction.

7. The thin film transistor according to claim 1, wherein the first region has a film thickness of at least 15 nm.

8. The thin film transistor according to claim 1, wherein the first region has a film thickness of at least 20 nm.

9. The thin film transistor according to claim 1, wherein a fluorine concentration of the oxide semiconductor layer is higher than a hydrogen concentration of the oxide semiconductor layer.

10. The thin film transistor according to claim 1, wherein metallic elements included in the oxide semiconductor layer further include at least one of gallium or zinc.

11. An organic EL display device including the thin film transistor according to claim 1, the organic EL display device comprising:
   pixels arranged in a matrix; and
   organic EL elements each formed corresponding to a different one of the pixels,
   wherein the thin film transistor is a driving transistor which drives the organic EL elements.

* * * * *